US010609848B2

United States Patent
Seo et al.

(10) Patent No.: US 10,609,848 B2
(45) Date of Patent: Mar. 31, 2020

(54) FLEXIBLE ELECTROMAGNETIC WAVE SHIELDING MATERIAL AND MANUFACTURING METHOD THEREFOR

(71) Applicant: AMOGREENTECH CO., LTD., Gimpo-si, Gyeonggi-do (KR)

(72) Inventors: In Yong Seo, Seoul (KR); Ui Young Jeong, Incheon (KR); Jun Woo Lee, Bucheon-si (KR)

(73) Assignee: Amogreentch Co., Ltd., Gimpo-si, Gyeonggi-do (KR)

( * ) Notice: Subject to any disclaimer, the term of this patent is extended or adjusted under 35 U.S.C. 154(b) by 0 days.

(21) Appl. No.: 16/467,191

(22) PCT Filed: Dec. 13, 2017

(86) PCT No.: PCT/KR2017/014635
§ 371 (c)(1),
(2) Date: Jun. 6, 2019

(87) PCT Pub. No.: WO2018/110969
PCT Pub. Date: Jun. 21, 2018

(65) Prior Publication Data
US 2019/0320562 A1 Oct. 17, 2019

(30) Foreign Application Priority Data

Dec. 13, 2016 (KR) .................. 10-2016-0169487
Dec. 13, 2017 (KR) .................. 10-2017-0171246

(51) Int. Cl.
*H05K 9/00* (2006.01)
*H01B 1/22* (2006.01)

(52) U.S. Cl.
CPC ............. *H05K 9/0083* (2013.01); *H01B 1/22* (2013.01); *H05K 9/0086* (2013.01)

(58) Field of Classification Search
CPC ..................... H05K 9/0083; H05K 9/0086
See application file for complete search history.

(56) References Cited

U.S. PATENT DOCUMENTS 6,455,864 B1 * 9/2002 Featherby ............. H01L 23/055
250/515.1
2002/0187330 A1 * 12/2002 Rohrbach ............ H05K 9/0083
428/297.4
(Continued)

FOREIGN PATENT DOCUMENTS

JP 10-316901 A 12/1998
JP 2000138426 A 5/2000
(Continued)

*Primary Examiner* — Hung V Ngo
(74) *Attorney, Agent, or Firm* — Rothwell, Figg, Ernst & Manbeck, P.C.

(57) ABSTRACT

Provided is a flexible electromagnetic wave shielding material. An electromagnetic wave shielding material according to an embodiment of the present invention includes a conductive nanofiber web having a nanofiber web formed of a nanofiber and including multiple pores and a metal layer covering at least a portion of the nanofiber disposed on a surface portion of the nanofiber web, wherein a metal particle is provided in at least some of the pores; and an elastic member brought in contact with one surface of the conductive nanofiber web of the metal layer. Thus, the electromagnetic wave shielding material is so excellent in elasticity that the electromagnetic wave shielding material may be freely changed in shape, and can be attached to and brought in complete contact with a surface where the electromagnetic wave shielding material is intended to be disposed even if the surface has a curved shape such as an uneven portion or a stepped portion, thus exhibiting excellent electromagnetic wave shielding performance. Also, it is possible to prevent deterioration of the electromagnetic wave shielding performance despite various shape changes. Furthermore, even if parts are provided in a narrow area at a high density, the flexible electromagnetic wave shielding material can be brought in close contact with mounted parts by overcoming a tight space between the parts and a stepped portion. Thus, the present invention may be easily employed for a light, thin, short, and small or flexible electronic device.

15 Claims, 2 Drawing Sheets

(56) References Cited

U.S. PATENT DOCUMENTS

| | | | | |
|---|---|---|---|---|
| 2010/0025100 A1* | 2/2010 | Hamano | ............... | H05K 9/0083 |
| | | | | 174/388 |
| 2010/0147577 A1* | 6/2010 | Tanaka | ................. | H05K 9/0083 |
| | | | | 174/350 |
| 2012/0177906 A1* | 7/2012 | Sousa | ................. | H05K 9/0083 |
| | | | | 428/297.4 |
| 2013/0221762 A1* | 8/2013 | Hong | ................... | H05K 9/0083 |
| | | | | 307/326 |
| 2017/0002488 A1* | 1/2017 | Tanaka | ...................... | B32B 5/02 |

FOREIGN PATENT DOCUMENTS

| | | |
|---|---|---|
| JP | 2014201862 A | 10/2014 |
| KR | 20090038994 A | 4/2009 |
| KR | 20100126094 A | 12/2010 |
| KR | 20130136386 A | 12/2013 |
| KR | 101424030 B1 | 7/2014 |
| KR | 20150016897 A | 2/2015 |
| KR | 101501057 B1 | 3/2015 |
| KR | 20170105987 A | 9/2017 |

\* cited by examiner

FLEXIBLE ELECTROMAGNETIC WAVE SHIELDING MATERIAL AND MANUFACTURING METHOD THEREFOR

Cross Reference to Related Application

This application is a 35 U.S.C. 371 National Phase Entry Application from PCT/KR2017/014635, filed Dec. 13, 2017, which claims the benefit of Korean Patent Application Nos. 10-2016-0169487 filed on Dec. 13, 2016 and 10-2017-0171246 filed on Dec. 13, 2017, the disclosures of which are incorporated herein in their entirety by reference.

TECHNICAL FIELD

The present invention relates to a flexible electromagnetic wave shielding material, and more particularly, to a flexible electromagnetic wave shielding material and a manufacturing method thereof.

BACKGROUND ART

Electromagnetic radiation is a phenomenon in which energy moves in a sinusoidal waveform while an electric field and a magnetic field cooperate with each other, and the phenomenon is useful for wireless communication or electronic devices such as a radar. The electric field is generated by voltage and is easily shielded due to long distances or obstacles such as a tree while the magnetic field is generated by current and is inversely proportional to a distance but is not easily shielded.

A recent electronic device is sensitive to electromagnetic interference (EMI) generated by an internal or external interference source, and there is a possibility of a malfunction of the electronic device being caused by electromagnetic waves. Also, a user who is using an electronic device may be harmfully affected by electromagnetic waves generated by the electronic device.

Accordingly, there is a growing interest in electromagnetic wave shielding materials for protecting human bodies or components of an electronic device against electromagnetic waves emitted from an electromagnetic wave source or from an external source.

Such an electromagnetic wave shielding material is typically formed of a conductive material, and shields electromagnetic waves emitted toward the electromagnetic wave shielding material by reflecting the electromagnetic waves or directing the electromagnetic waves to the ground. An example of the electromagnetic wave shielding material may be a metal casing or a metal plate. Here, it is difficult for the electromagnetic wave shielding material to exhibit elasticity and it is not easy to change the electromagnetic wave shielding material to various shapes or to recover the electromagnetic wave shielding material once manufactured. Thus, the electromagnetic wave shielding material is difficult to employ in various application fields. In particular, it may be difficult for the electromagnetic wave shielding material such as a metal plate or a metal thin film to fully exhibit electromagnetic wave shielding performance because the electromagnetic wave shielding material is difficult to bring into close contact with a component requiring protection from an electromagnetic wave generating component or an electromagnetic wave source without a gap therebetween and also a crack may be generated due to bending at a stepped portion or an uneven portion.

In order to solve such a problem, an electromagnetic wave shielding material obtained by forming a conductive coating layer on a lightweight supporting member such as a polymer film has been recently produced. However, the electromagnetic wave shielding material has limitation on electromagnetic wave shielding performance in accordance with the limitation of an available area of the supporting member to be coated. Also, a film having a certain thickness or greater is insufficiently flexible, and thus may be difficult to bring into complete contact with components having a stepped portion or an uneven portion or to freely change in shape once manufactured in a specific shape. Even when the shape change is possible, a crack, a delamination, or the like may frequently be generated in a covered conductive coating layer during the shape change.

DETAILED DESCRIPTION OF THE INVENTION

Technical Problem

The present invention is designed to solve the above problems and is directed to providing a flexible electromagnetic wave shielding material that is so excellent in elasticity that the flexible electromagnetic wave shielding material can be changed in shape freely at his/her disposal and thus can be brought in complete contact with various shapes/structures, such as an uneven portion or a stepped portion, of a surface to which the flexible electromagnetic wave shielding material will be applied.

Also, the present invention is also directed to providing a flexible electromagnetic wave shielding material capable of preventing deterioration of electromagnetic wave shielding performance despite various shape changes.

Further, the present invention is also directed to providing an electromagnetic wave shielding-type circuit module capable of being easily employed for a light, thin, short, and small or flexible electronic device having components provided in a small area at a high density, and an electronic device having the same.

Technical Solution

In order to solve the above-described problems, there is provided a flexible electromagnetic wave shielding material including a conductive nanofiber web having a nanofiber web formed of a nanofiber and including multiple pores and a metal layer covering at least a portion of the nanofiber disposed on a surface portion of the nanofiber web, wherein a metal particle is provided in at least some of the pores; and an elastic member brought in contact with one surface of the conductive nanofiber web of the metal layer.

According to an embodiment of the present invention, the nanofiber may be formed of a fiber forming component containing one or more types selected from a group consisting of a polyvinylidene fluoride (PVDF)-based resin and a urethane-based resin.

Also, the fiber forming component may contain the PVDF-based resin and the urethane-based resin at a weight ratio of 1:0.43 to 1:2.35.

Also, the nanofiber may have an average diameter of 150 nm to 5 μm.

Also, the nanofiber web may have a thickness of 4 μm to 30 μm and a basis weight of 3.00 g/m² to 20.00 g/m².

Also, the conductive nanofiber web may be formed through a spinning solution containing a resin, a solvent, and a metal particle, and the spinning solution may have 30 to 70 parts by weight of the metal particle, which includes one or more types of metals selected from a group consisting of nickel, copper, silver, gold, chromium, platinum, titanium alloys, and stainless steel, with respect to 100 parts by weight of the resin.

Also, the conductive nanofiber web may have a porosity of 30% to 80%.

Also, the elastic member may contain a urethane-based resin.

Also, the elastic member may have an average thickness of 10 μm to 150 μm.

Also, the metal layer may contain one or more types of metals selected from a group consisting of nickel (Ni) and copper (Cu).

Also, the metal layer may be formed by sequentially stacking nickel (Ni), copper (Cu), and nickel (Ni).

Also, the metal layer may have an average thickness of 1 μm to 5 μm.

The present invention provides a method of manufacturing a flexible electromagnetic wave shielding material, the method including steps of: (1) forming a nanofiber web having a metal particle in at least some pores; (2) forming an elastic member on a lower surface of the nanofiber web; and (3) manufacturing a conductive nanofiber web by forming a metal layer to cover at least a portion of a nanofiber disposed on a surface portion of the nanofiber web.

According to an embodiment of the present invention, step (1) may be performed by electrospinning a spinning solution containing a fiber forming component, a solvent, and a metal particle.

The present invention also provides an electromagnetic wave shielding-type circuit module including a circuit board with an element mounted thereon; and the above-described flexible electromagnetic wave shielding material provided on the circuit board to cover at least an upper portion and a lateral portion of the element.

Meanwhile, the present invention provides an electronic device including the electromagnetic wave shielding-type circuit module.

Advantageous Effects of the Invention

The electromagnetic wave shielding material according to the present invention is so excellent in elasticity that the electromagnetic wave shielding material can be freely changed in shape at his/her disposal and can be attached to and brought in complete contact with even a curved shape, such as an uneven portion or a stepped portion, of a surface where the electromagnetic wave shielding material is to be disposed. Also, it is possible to prevent deterioration of the electromagnetic wave shielding performance despite various shape changes. Furthermore, even if parts are provided in a narrow area at a high density, the electromagnetic wave shielding material can be brought in close contact with mounted parts by overcoming a tight space between the parts and a stepped portion. Accordingly, it is possible to exhibit excellent electromagnetic wave shielding performance, and thus the present invention can be easily employed for a light, thin, short, and small or flexible electronic device.

BEST MODE

Figure 1:
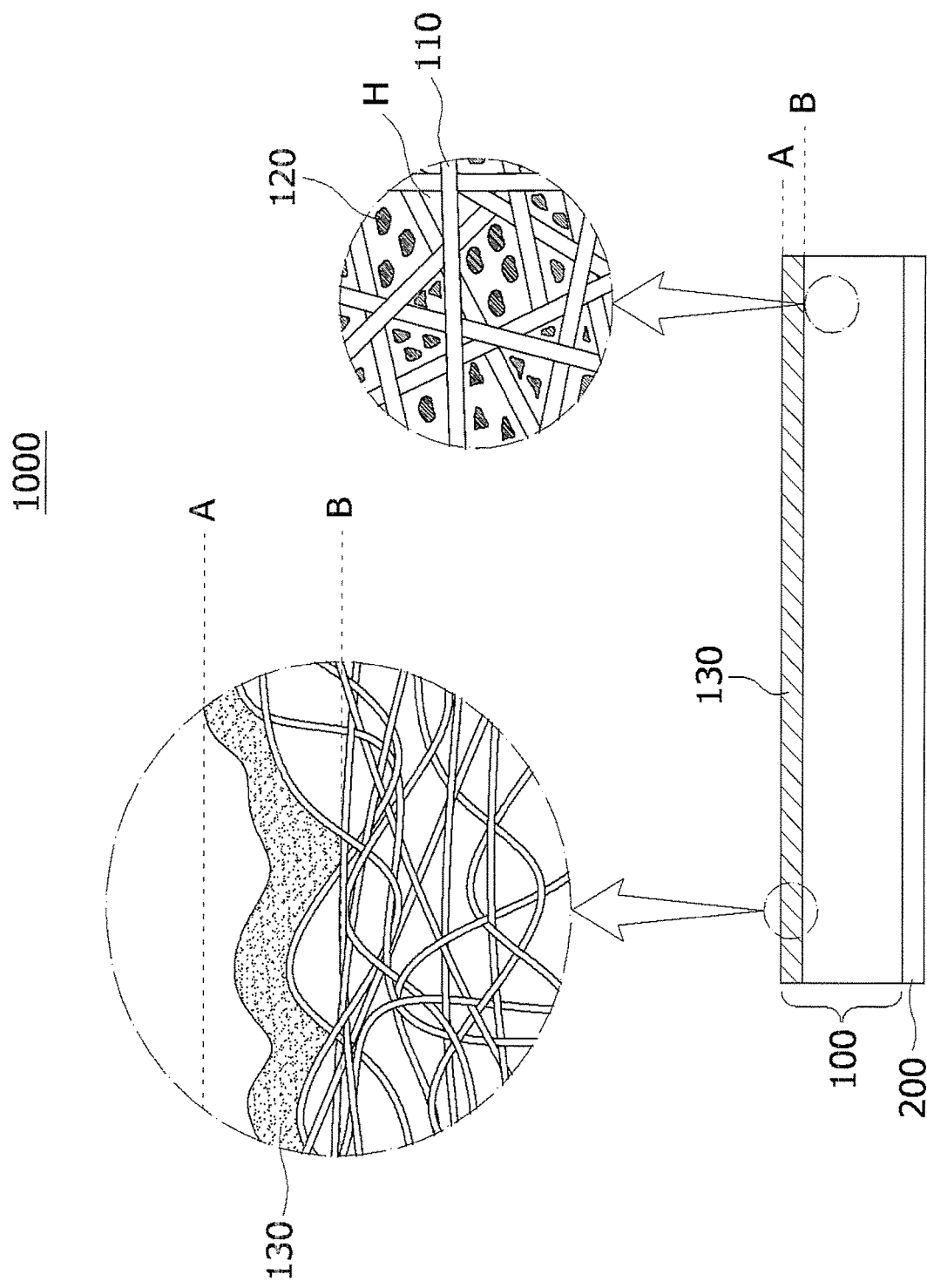
FIG. 1 is a sectional view of a flexible electromagnetic wave shielding material according to an embodiment of the present invention.

Hereinafter, embodiments of the present invention will be described in detail with reference to the accompanying drawings so that they can be easily carried out by those skilled in the art. The present invention may, however, be embodied in many different forms and should not be construed as being limited to the embodiments set forth herein. In the accompanying drawings, portions irrelevant to the description of the present invention will be omitted for clarity. Moreover, like reference numerals refer to like elements throughout.

Referring to FIG. 1, a flexible electromagnetic wave shielding material 1000 according to an embodiment of the present invention includes a conductive nanofiber web 100 having a nanofiber web 110 formed of a nanofiber and including multiple pores H, a metal layer 130 covering at least a portion of the nanofiber disposed on a surface portion of the nanofiber web 110, and a metal particle 120 provided in at least some of the pores; and an elastic member 200 brought in contact with one surface of the conductive nanofiber web 100.

The nanofiber web 110 provided in the conductive nanofiber web 100 has a three-dimensional network structure and includes multiple pores H. The multiple pores H may be formed by being surrounded by nanofibers forming the nanofiber web 110.

The nanofibers are capable of forming the nanofiber web, and any resin that may be typically used in the art to exhibit elasticity of the nanofiber web may be used without limitation. Preferably, the resin may contain one or more types selected from the group consisting of polyurethane, polystyrene, polyvinylalcohol, polymethyl methacrylate, polylactic acid, polyethylene oxide, polyvinyl acetate, polyacrylic acid, polycaprolactone, polyacrylonitrile, polyvinylpyrrolidone, polyvinylchloride, polycarbonate, polycarbonate (PC), polyetherimide, polyethersulphone, polybenzimidazole, polyethylene terephthalate, polybutylene terephthalate, and a fluorine-based compound. Also, the fluorine-based compound may include one or more types selected from the group consisting of polytetrafluoroethylene (PTFE)-based compounds, tetrafluoroethylene-perfluoroalkyl vinyl ether copolymer (PFA)-based compounds, tetrafluoroethylene-hexafluoropropylene copolymer (FEP)-based compounds, tetrafluoroethylene-hexafluoropropylene-perfluoroalkyl vinyl ether copolymer (EPE)-based compounds, tetrafluoroethylene-ethylene copolymer (ETFE)-based compounds, polychlorotrifluoroethylene (PCTFE)-based compounds, chlorotrifluoroethylene-ethylene copolymer (ECTFE)-based compounds, and polyvinylidene fluoride (PVDF)-based compounds. Preferably, the nanofibers may be obtained by blending and then spinning a fiber forming component including one or more types selected from the group consisting of a urethane-based resin and a PVDF-based resin, which is a fluorine-based compound, in a spinning solution so that the nanofiber web 110 formed of the nanofibers and the conductive nanofiber web 100 including the nanofiber web 110 can exhibit enhanced elasticity, heat resistance, chemical resistance, and mechanical strength. As an example, the fiber forming component may contain the PVDF-based resin and the urethane-based resin at a weight ratio of 1:0.43 to 1:2.35, preferably 1:0.5 to 1:2, and most preferably 1:1. When the weight ratio between the PVDF-based resin and the urethane-based resin is less than 1:043, the elasticity of the flexible electromagnetic wave shielding material may be deteriorated. When the weight ratio exceeds 1:2.35, the mechanical properties may be deteriorated.

Also, any nanofibers having an average diameter capable of typically forming a web in the art may be used as the nanofibers without limitation. Preferably, the average diameter may range from 150 nm to 5 μm, more preferably from 150 nm to 700 nm, and most preferably from 200 nm to 600 nm. When the average diameter of the nanofibers is less than 150 nm, the mechanical strength of the manufactured flexible electromagnetic wave shielding material may be deteriorated. When the average diameter exceeds 5 μm, the elasticity may be deteriorated.

Also, the nanofiber web 110 may have a thickness of 4 μm to 30 μm, more preferably 4 μm to 13 μm, and most preferably 5 μm to 12 μm. When the thickness of the nanofiber web 110 is less than 4 μm, the mechanical strength may be deteriorated or the handling may not be easy and an interlayer delamination may be generated. When the thickness exceeds 30 μm, the elasticity may be deteriorated.

Also, the nanofiber web 110 may have a basis weight of 3 g/m$^2$ to 20 g/m$^2$ and preferably 5 g/m$^2$ to 15 g/m$^2$. When the basis weight of the nanofiber web 110 is less than 3 g/m$^2$, the mechanical strength may be deteriorated or the handling may not be easy and an interlayer delamination may be generated. When the basis weight exceeds 20 g/m$^2$, the elasticity may be deteriorated.

The metal particle 120 is provided in at least some of the pores of the conductive nanofiber web 100 and functions to maintain the shielding force of the flexible electromagnetic wave shielding material 1000. Also, the metal particle 120 may contain one or more types selected from the group consisting of nickel, copper, silver, gold, chromium, platinum, titanium alloys, and stainless steel, preferably nickel or silver, and more preferably a nickel nanorod or a sliver nanorod in order to maintain a shielding force.

Also, the metal particle 120 may be provided in an amount of 30 to 70 parts by weight and preferably 35 to 65 parts by weight with respect to 100 parts by weight of the fiber forming component. As an example, the metal particle may be provided in an amount of 50 parts by weight with respect to 100 parts by weight of the fiber forming component. When the metal particle 120 is provided in an amount of less than 30 parts by weight with respect to 100 parts by weight of the nanofiber web 110, the retention of the shielding efficiency may be deteriorated. When the metal particle 120 exceeds 70 parts by weight, the elasticity may be deteriorated.

Also, the metal particle 120 may be provided in at least some of the pores of the conductive nanofiber web 100, and the size of the metal particle 120 is not limited as long as the elasticity of the conductive nanofiber web 100 can be improved. As an example, when the metal particle 210 has a nanorod shape, the metal particle 120 may have a diameter of 0.7 μm to 1.1 μm and a length of 1.5 μm to 3.5 μm and preferably a diameter of 0.8 μm to 1.1 μm and a length of 2 μm to 3 μm, but the present invention is not limited thereto.

The conductive nanofiber web 100 has a metal layer 130 that covers at least a portion of the nanofiber disposed on an a surface portion of the nanofiber web 110.

Meanwhile, the term "surface portion" used herein refers to a nanofiber exposed on the surface when the nanofiber web 110 is viewed at the top regardless of depth. In detail, as shown in FIG. 1, a part where the metal layer 130 is formed in region A-B may be a portion of the nanofiber disposed on the surface portion of the nanofiber web 110. Although not shown in FIG. 1, when a part exposed from an upper portion of the nanofiber web 110 includes a pore, a range from the nanofiber web 110 to the exposed pore is included in the surface portion.

As shown in FIG. 1, the metal layer 130 may be provided over region A-B, where point A represents an uppermost point of the metal layer 130 formed on the surface portion and point B represents a lowermost point of the metal layer 130 formed on the surface portion. Also, as an example, when the exposed part includes a pore and the lowermost point of the metal layer 130 is located on the pore, point B represents the lowermost part of the metal layer 130 formed in the exposed pore.

Also, the metal layer 130 may have an average thickness of 1 μm to 5 μm and preferably 2 μm to 4 μm. When the average thickness of the metal layer 130 is less than 1 μm, the shielding force may be deteriorated. When the average thickness exceeds 5 μm, the elasticity may be deteriorated.

Meanwhile, any material capable of typically improving the shielding force in the art may be used without limitation to form the metal layer 130. Preferably, the metal layer 130 may be formed to contain one or more metals selected from the group consisting of nickel and copper. More preferably, the metal layer 130 formed by sequentially stacking nickel, copper, and nickel may be advantageous in improving the shielding force and the elasticity.

When the metal layer 130 is formed by sequentially stacking nickel, copper, and nickel as described above, the first nickel layer may function to facilitate formation of a copper layer, the second copper layer may function to control the electric conductivity of the electromagnetic wave shielding material to be manufactured, and the third nickel layer may function to prevent oxidation of the copper layer.

Also, the porosity of the conductive nanofiber web 100 is not limited as long as the elasticity can be improved. Preferably, the porosity may range from 30% to 80% and more preferably from 40% to 70%. When the porosity of the conductive nanofiber web 100 is less than 30%, the elasticity may be deteriorated. When the porosity exceeds 80%, the interlayer delamination may be generated.

Next, the elastic member 200 functions to improve the elasticity of the flexible electromagnetic wave shielding material, and any material capable of typically improving the elasticity may be used without limitation. Preferably, the use of a urethane-based film may be advantageous in improving the elasticity of the flexible electromagnetic wave shielding material 1000.

Also, the thickness of the elastic member 200 is not limited as long as the elasticity of the flexible electromagnetic wave shielding material 1000 can be improved. Preferably, an average thickness of the elastic member 200 may range from 10 μm to 150 μm, more preferably from 25 μm to 110 μm, and most preferably 30 μm to 100 μm. When the average thickness of the elastic member 200 is less than 10 μm, the elasticity may be deteriorated. When the average thickness exceeds 150 μm, the interlayer delamination may be generated.

Meanwhile, the electromagnetic wave shielding material according to an embodiment of the present invention is manufactured by a method including steps of: (1) forming a nanofiber web having a metal particle in at least some pores; (2) forming an elastic member on a lower surface of the nanofiber web; and (3) manufacturing a conductive nanofiber web by forming a metal layer to cover at least a portion of a nanofiber disposed on a surface portion of the nanofiber web.

First, in step (1) according to the present invention, the nanofiber web 110 having the metal particle 120 is formed in at least some pores.

Any method capable of being typically used in the art may be used without limitation as the method of providing the metal particle 120 in at least some pores of the nanofiber web 110. Preferably, by electrospinning a spinning solution containing a fiber forming component, a solvent, and a metal particle, it is possible to form the nanofiber web 110 having the metal particle 120 in at least some pores.

Meanwhile, as the electrospinning, dry electrospinning or wet electrospinning may be appropriately selected in consideration of the type of the fiber forming component contained in the spinning solution, the type of the solvent contained in the spinning solution, and the like. However, the present invention has no particular limitation thereon. Also, any well-known fiber web manufacturing method may be used to manufacture the nanofiber web through a spun nanofiber. As an example, the nanofiber web may be manufactured through a calendering process on a fiber mat by a collector collecting and accumulating the spun nanofiber.

Next, in step (2) according to the present invention, an elastic member 200 is formed on a lower surface of the nanofiber web 110.

Any method capable of being typically used in the art may be used to form the elastic member 200 on the lower surface of the nanofiber web 110. Preferably, an upper surface of the elastic member 200 may be laminated with the lower surface of the nanofiber web 110 in contact with the elastic member 200 through thermal bonding. Meanwhile, the conditions of the thermal bonding may be changed depending on the type of the resin forming the nanofibers, and thus the present invention does not particularly limit the conditions.

Next, in step (3) according to the present invention, the conductive nanofiber web 100 may be manufactured by forming the metal layer 130 to cover at least a portion of the nanofiber disposed on the surface portion of the nanofiber web 110.

Any metal layer forming method capable of being typically used in the art may be used for the metal layer 130 without limitation. Preferably, the metal layer 130 may be formed through electroless plating, sputtering, screen printing, or casting. More preferably, the metal layer 130 may be formed through electroless plating, screen printing, or casting. Most preferably, the metal layer 130 may be formed through electroless plating or screen printing, but the present invention is not limited thereto.

Figure 2:
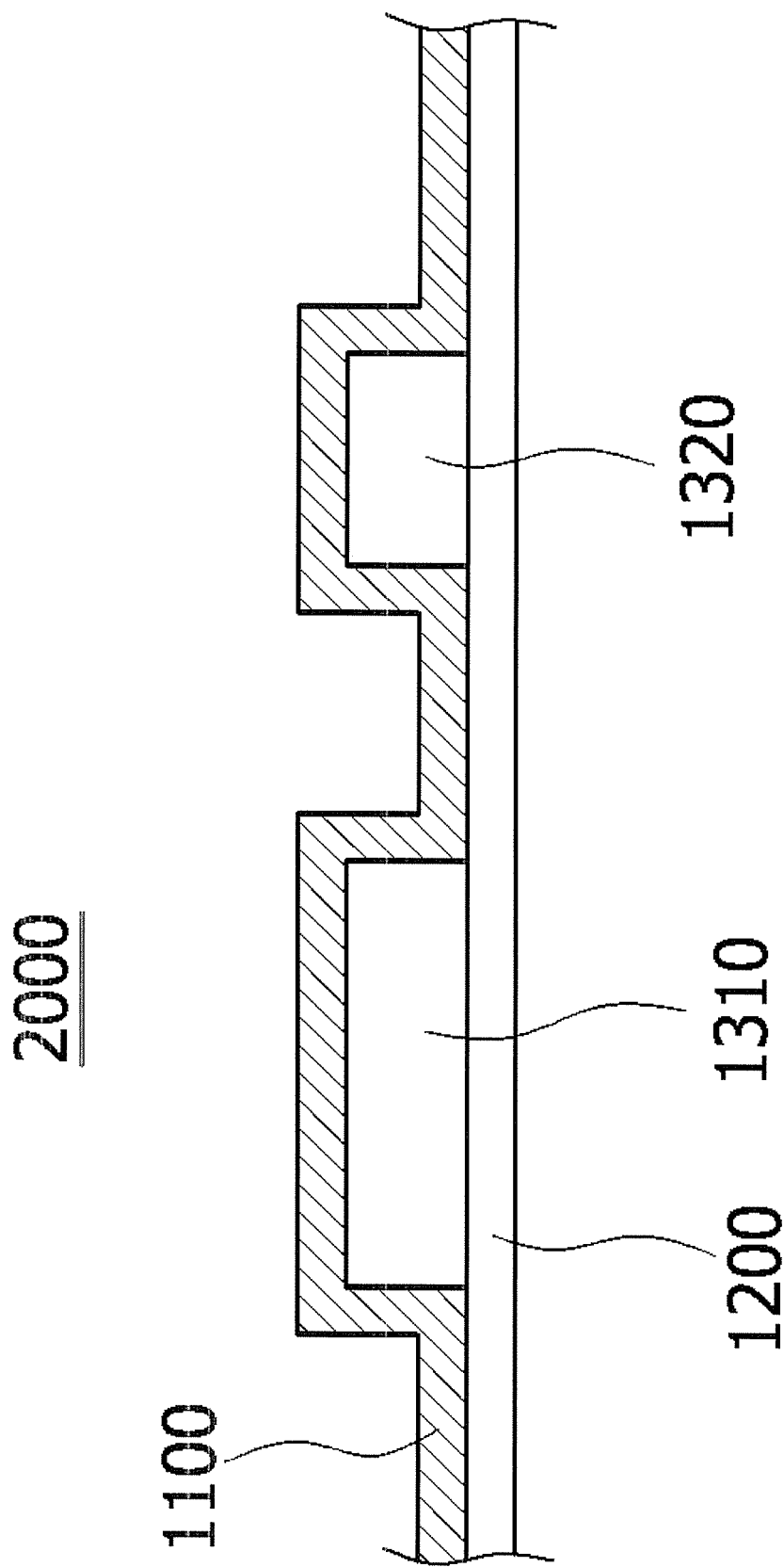
FIG. 2 is a sectional view of an electromagnetic wave shielding-type circuit module according to an embodiment of the present invention.

The above-described flexible electromagnetic wave shielding material 1100 may be implemented in an electromagnetic wave shielding-type circuit module 2000 as shown in FIG. 2. In detail, an electromagnetic wave shielding material 1100 may be provided on an upper portion of a circuit board 1200 where elements 1310 and 1320 are mounted to cover an upper portion and a lateral portion of the elements 1310 and 1320.

The circuit board 1200 may be a well-known circuit board provided in an electronic device. As an example, the circuit board 1200 may be a printed circuit board (PCB), a flexible printed circuit board (FPCB), or the like. The size and thickness of the circuit board 1200 may be changed depending on an internal design of an electronic device to be implemented. Therefore, the present invention has no particular limitation thereon.

Also, the elements 1310 and 1320 may be well-known elements mounted on a circuit board in an electronic device such as a driving chip and may be elements that easily malfunction since the elements generate electromagnetic waves and/or heat or are sensitive to electromagnetic waves.

The electromagnetic wave shielding material 1100 according to an embodiment of the present invention may be attached to and brought in close contact with the lateral portion of the elements even when a separation distance between the adjacent elements 1310 and 1320 is small or even when there is a stepped portion due to the thicknesses of the elements 1310 and 1320, as shown in FIG. 2. Therefore, the electromagnetic wave shielding material 1100 is advantageous in exhibiting enhanced electromagnetic wave shielding performance.

The electromagnetic wave shielding material according to the present invention is so excellent in elasticity that the electromagnetic wave shielding material can be freely changed in shape at his/her disposal and can be attached to and brought in complete contact with even a curved shape, such as an uneven portion or a stepped portion, of a surface where the electromagnetic wave shielding material is to be disposed. Also, it is possible to prevent deterioration of the electromagnetic wave shielding performance despite various shape changes. Furthermore, even if parts are provided in a narrow area at a high density, the electromagnetic wave shielding material can be brought in close contact with mounted parts by overcoming a tight space between the parts and a stepped portion. Accordingly, it is possible to exhibit excellent electromagnetic wave shielding performance, and thus the present invention can be easily employed for a light, thin, short, and small or flexible electronic device.

MODE OF THE INVENTION

The present invention will be described in detail with reference to the following embodiments. However, the following embodiments should not be construed as limiting the scope of the present invention, but should be construed as facilitating an understanding of the present invention.

Embodiment 1

First, in order to manufacture a spinning solution, a mixture solution was manufactured by mixing polyvinylidene fluoride and polyurethane as a fiber forming component at a weight ratio of 1:1 and dissolving 15 g of the fiber forming component in 85 g of dimethylacetamide and acetone at a weight ratio of 70:30 using a magnetic bar at 80° C. for 6 hours. A nickel rod having an average diameter of 1 μm and an average length of 2.5 μm was mixed in the mixture solution in an amount of 50 parts by weight with respect to 100 parts by weight of the fiber forming component, by means of a mixing mixer. The spinning solution was poured into a solution tank of an electrospinning apparatus and then discharged at a rate of 15 μL/min/hole. In this case, a nanofiber web formed of a PVDF/PU composite nanofiber was manufactured by maintaining the temperature and humidity of the spinning section at 30° C. and 50%, setting a distance between a collector and a spinning nozzle tip to 20 cm, applying a voltage of 40 kV or more to a spin nozzle pack using a high voltage generator, and also applying an air pressure of 0.03 MPa per spin pack nozzle. Next, a calendering process was carried out on the nanofiber web by applying heat and pressure at 140° C. or higher and 1 kgf/cm$^2$ in order to dry the remaining solvent and moisture. In this case, the manufactured nanofiber web had a thickness 10 μm and a basis weight of 9.2 g/m$^2$.

Subsequently, an elastic member was laminated with a lower surface of the nanofiber web by thermally bonding a polyurethane film having an average thickness of 100 μm to the lower surface as the nanofiber web at 140° C. Subsequently, a flexible electromagnetic wave shielding material was manufactured by forming a metal layer having an average thickness of 3 μm through sequential electroless plating of nickel, copper, and nickel to cover at least a portion of the nanofiber disposed on an upper surface portion of the laminated nanofiber web. The conductive nanofiber web provided in the manufactured flexible electromagnetic wave shielding material had a porosity of 40%.

Embodiments 2 to 22 and Comparative Examples 1 to 3

Flexible electromagnetic wave shielding materials as shown in Tables 1 to 4 below were manufactured in the same way as in Embodiment 1, except that the thickness and basis weight of the nanofiber web, the metal particle content, the porosity of the conductive nanofiber web, the thickness of the metal layer, and the thickness of the elastic member were modified as shown in Tables 1 to 4 below.

Experimental Example 1

The physical properties of the flexible electromagnetic wave shielding materials manufactured in the embodiments and comparative examples were evaluated and shown in Tables 1 to 4.

1. Evaluation of Elasticity (Elastic Recovery Rate)

The flexible electromagnetic wave shielding materials manufactured according to the embodiments and the comparative examples were elongated by 50% through a Universal Testing Machine (UTM) (Instron, 3343) and then the external force was removed to evaluate the elasticity using Equation 1 below.

Elasticity (Elastic Recovery Rate) (%)=[(Length Increased by External Force)−(Length with External Force Removed)]/[(Length Increased by External Force)−(Initial Length)]×100(%)　　[Equation 1]

2. Initial Electromagnetic Wave Shielding Performance

The surface resistance of the conductive fiber web was measured on the flexible electromagnetic wave shielding materials manufactured according to the embodiments and the comparative examples through a resistance meter (HIOKI 3540 mΩ HITESTER, HIOKI). The measured resistance value according to the embodiment was expressed by a relative percentage with respect to the measured value of Comparative Example 1 being set to 100.

3. Electromagnetic Wave Shielding Performance Variation

The flexible electromagnetic wave shielding materials manufactured according to the embodiments and the comparative examples were elongated by a factor of 1.2 in the transverse direction and then by a factor of 1.2 in the longitudinal direction by means of a jig. This process was repeated three times.

Subsequently, a resistance value B for each specimen after elongation was found using the method of measuring the initial electromagnetic wave shielding performance, and a variation of each specimen according to elongation with respect to an initial resistance value A of each specimen was calculated using Equation 2.

In this case, the variation being increased means that the electromagnetic wave shielding performance is deteriorated.

Variation (%)=(B−A)×100÷A　　[Equation 2]

4. Evaluation of Interlayer Delamination

After elasticity was evaluated on the flexible electromagnetic wave shielding materials manufactured according to the embodiments and the comparative examples, the case in which no interlayer delamination was generated was marked with ○, and the case in which an interlayer delamination was generated was marked with x to evaluate interlayer delamination. The results were shown in Tables 1 to 4 below.

TABLE 1

| Classification | | Embodiment 1 | Embodiment 2 | Embodiment 3 | Embodiment 4 | Embodiment 5 | Embodiment 6 | Embodiment 7 |
|---|---|---|---|---|---|---|---|---|
| Nanofiber Web | Thickness (μm) | 10 | 1 | 4 | 13 | 35 | 10 | 10 |
| | Basis Weight (g/m$^2$) | 9.2 | 9.2 | 9.2 | 9.2 | 9.2 | 1 | 5 |
| Metal Particle | Content (Parts by Weight) | 50 | 50 | 50 | 50 | 50 | 50 | 50 |
| Metal Layer | Thickness (μm) | 3 | 3 | 3 | 3 | 3 | 3 | 3 |
| Conductive Nanofiber Web | Porosity (%) | 40 | 40 | 40 | 40 | 40 | 82 | 68 |
| Elastic Member | Thickness (μm) | 100 | 100 | 100 | 100 | 100 | 100 | 100 |
| Elasticity (%) | | 96 | 87 | 94 | 89 | 72 | 88 | 91 |
| Initial Electromagnetic Wave Shielding Performance (%) | | 87.3 | 87.1 | 87.3 | 87.2 | 87.4 | 85.2 | 86.4 |
| Electromagnetic Wave Shielding Performance Variation (%) | | 3.9 | 11.3 | 4.6 | 3.9 | 4.2 | 15.1 | 4.2 |
| Evaluation on Prevention of Interlayer Delamination | | ○ | X | ○ | ○ | ○ | X | ○ |

TABLE 2

| Classification | | Embodiment 8 | Embodiment 9 | Embodiment 10 | Embodiment 11 | Embodiment 12 | Embodiment 13 |
|---|---|---|---|---|---|---|---|
| Nanofiber Web | Thickness (μm) | 10 | 10 | 10 | 10 | 10 | 10 |
| | Basis Weight (g/m$^2$) | 15 | 25 | 9.2 | 9.2 | 9.2 | 9.2 |
| Metal Particle | Content (Parts by Weight) | 50 | 50 | 20 | 35 | 65 | 80 |
| Metal Layer | Thickness (μm) | 3 | 3 | 3 | 3 | 3 | 3 |

TABLE 2-continued

| Classification | | Embodiment 8 | Embodiment 9 | Embodiment 10 | Embodiment 11 | Embodiment 12 | Embodiment 13 |
|---|---|---|---|---|---|---|---|
| Conductive Nanofiber Web | Porosity (%) | 37 | 26 | 84 | 70 | 36 | 24 |
| Elastic Member | Thickness (μm) | 100 | 100 | 100 | 100 | 100 | 100 |
| | Elasticity (%) | 92 | 76 | 94 | 96 | 90 | 70 |
| Initial Electromagnetic Wave Shielding Performance (%) | | 87.0 | 87.1 | 84.3 | 87.1 | 87.3 | 87.4 |
| Electromagnetic Wave Shielding Performance Variation (%) | | 4.5 | 4.4 | 23.9 | 4.9 | 3.5 | 2.9 |
| Evaluation on Prevention of Interlayer Delamination | | ○ | ○ | X | ○ | ○ | ○ |

TABLE 3

| Classification | | Embodiment 14 | Embodiment 15 | Embodiment 16 | Embodiment 17 | Embodiment 18 | Embodiment 19 |
|---|---|---|---|---|---|---|---|
| Nanofiber Web | Thickness (μm) | 10 | 10 | 10 | 10 | 10 | 10 |
| | Basis Weight (g/m$^2$) | 9.2 | 9.2 | 9.2 | 9.2 | 9.2 | 9.2 |
| Metal Particle | Content (Parts by Weight) | 50 | 50 | 50 | 50 | 50 | 50 |
| Metal Layer | Thickness (μm) | 0.3 | 2 | 4 | 7 | 3 | 3 |
| Conductive Nanofiber Web | Porosity (%) | 40 | 40 | 40 | 40 | 40 | 40 |
| Elastic Member | Thickness (μm) | 100 | 100 | 100 | 100 | 5 | 25 |
| | Elasticity (%) | 90 | 92 | 91 | 71 | 68 | 87 |
| Initial Electromagnetic Wave Shielding Performance (%) | | 98.1 | 88.1 | 86.1 | 85.3 | 6.9 | 87.0 |
| Electromagnetic Wave Shielding Performance Variation (%) | | 6.7 | 4.8 | 4 | 3.8 | 8.1 | 4.4 |
| Evaluation on Prevention of Interlayer Delamination | | ○ | ○ | ○ | ○ | ○ | ○ |

TABLE 4

| Classification | | Embodiment 20 | Embodiment 21 | Comparative Example 1 | Comparative Example 2 | Comparative Example 3 |
|---|---|---|---|---|---|---|
| Nanofiber Web | Thickness (μm) | 10 | 10 | 10 | 10 | 10 |
| | Basis Weight (g/m$^2$) | 9.2 | 9.2 | 9.2 | 9.2 | 9.2 |
| Metal Particle | Content (Parts b Weight)y | 50 | 50 | 50 | — | 50 |
| Metal Layer | Thickness (μm) | 3 | 3 | — | 3 | 3 |
| Conductive Nanofiber Web | Porosity (%) | 40 | 40 | 40 | 90 | 40 |
| Elastic Member | Thickness (μm) | 110 | 180 | 100 | 100 | — |
| | Elasticity (%) | 96 | 97 | 95 | 69 | 47 |
| Initial Electromagnetic Wave Shielding Performance (%) | | 87.1 | 87.3 | 100 | 82.6 | 87.2 |
| Electromagnetic Wave Shielding Performance Variation (%) | | 3.8 | 5.2 | 5.2 | 28.3 | 5.6 |
| Evaluation on Prevention of Interlayer Delamination | | ○ | X | ○ | X | ○ |

As can be seen from above Tables 1 to 4, Embodiments 1, 3, 4, 7, 8, 11, 12, 15, 16, 19, and 20, which satisfy all of the thickness and basis weight of the nanofiber web, the metal particle content, the porosity of the conductive nanofiber web, the thickness of the metal layer, and the thickness of the elastic member have high elasticity, excellent initial electromagnetic wave shielding performance, small electromagnetic wave shielding performance variation, and no interlayer delamination compared to Embodiments 2, 5, 6, 9, 10, 13, 14, 17, 18, and 21 and Comparative Examples 1 to 3, which does not satisfy any one of the conditions.

While embodiments of the present invention have been described above, the scope of the present invention is not limited to the disclosed embodiments. Those skilled in the art of the present invention can readily suggest another embodiment by adding, modifying, or deleting components without departing from the scope of the present invention, but the suggested embodiment is construed as being within the scope of the present invention.

The invention claimed is:

1. A flexible electromagnetic wave shielding material comprising:
   a conductive nanofiber web having a nanofiber web formed of a nanofiber and including multiple pores and a metal layer covering at least a portion of the nanofiber disposed on a surface portion of the nanofiber web, wherein a metal particle is provided in at least some of the pores; and
   an elastic member brought in contact with one surface of the conductive nanofiber web.

2. The flexible electromagnetic wave shielding material of claim 1, wherein the nanofiber is formed of a fiber forming component containing one or more types selected from a group consisting of a polyvinylidene fluoride (PVDF)-based resin and a urethane-based resin.

3. The flexible electromagnetic wave shielding material of claim 2, wherein the fiber forming component contains the PVDF-based resin and the urethane-based resin at a weight ratio of 1:0.43 to 1:2.35.

4. The flexible electromagnetic wave shielding material of claim 1, wherein the nanofiber has an average diameter of 150 nm to 5 μm.

5. The flexible electromagnetic wave shielding material of claim 1, wherein the nanofiber web has a thickness of 4 μm to 30 μm and a basis weight of 3.00 g/m$^2$ to 20.00 g/m$^2$.

6. The flexible electromagnetic wave shielding material of claim 1, wherein,
the conductive nanofiber web is formed through a spinning solution containing a resin, a solvent, and a metal particle, and
the spinning solution has 30 to 70 parts by weight of the metal particle, which includes one or more types of metals selected from a group consisting of nickel, copper, silver, gold, chromium, platinum, titanium alloys, and stainless steel, with respect to 100 parts by weight of the resin.

7. The flexible electromagnetic wave shielding material of claim 1, wherein the conductive nanofiber web has a porosity of 30% to 80%.

8. The flexible electromagnetic wave shielding material of claim 1, wherein the elastic member contains a urethane-based resin.

9. The flexible electromagnetic wave shielding material of claim 1, wherein the elastic member has an average thickness of 10 μm to 150 μm.

10. The flexible electromagnetic wave shielding material of claim 1, wherein the metal layer contains one or more types of metals selected from a group consisting of nickel (Ni) and copper (Cu).

11. The flexible electromagnetic wave shielding material of claim 1, wherein the metal layer is formed by sequentially stacking nickel (Ni), copper (Cu), and nickel (Ni).

12. The flexible electromagnetic wave shielding material of claim 1, wherein the metal layer has an average thickness of 1 μm to 5 μm.

13. An electromagnetic wave shielding-type circuit module comprising:
a circuit board with an element mounted thereon; and
the flexible electromagnetic wave shielding material according to claim 1, the flexible electromagnetic wave shielding material provided on the circuit board to cover at least an upper portion and a lateral portion of the element.

14. A method of manufacturing a flexible electromagnetic wave shielding material, the method comprising steps of:
(1) forming a nanofiber web having a metal particle in at least some pores;
(2) forming an elastic member on a lower surface of the nanofiber web; and
(3) manufacturing a conductive nanofiber web by forming a metal layer to cover at least a portion of a nanofiber disposed on a surface portion of the nanofiber web.

15. The method of claim 14, wherein step (1) is performed by electrospinning a spinning solution containing a fiber forming component, a solvent, and a metal particle.

* * * * *